US006598188B1

(12) United States Patent
Locke et al.

(10) Patent No.: US 6,598,188 B1
(45) Date of Patent: Jul. 22, 2003

(54) ERROR-CORRECTED CODEWORD CONFIGURATION AND METHOD

(75) Inventors: Michael Locke, Santa Clara, CA (US); Kapil Gulati, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/569,104

(22) Filed: May 10, 2000

Related U.S. Application Data

(60) Provisional application No. 60/133,365, filed on May 10, 1999.

(51) Int. Cl.[7] .................. G06F 11/00; H03M 13/00
(52) U.S. Cl. .................. 714/704; 714/759; 714/779
(58) Field of Search .................. 714/704, 759, 714/758, 779, 781, 784, 786, 799, 800

(56) References Cited

U.S. PATENT DOCUMENTS

| 5,091,945 A | * | 2/1992 | Kleijn .................. 704/219 |
| 5,544,178 A | * | 8/1996 | Zook .................. 714/786 |
| 6,025,881 A | * | 2/2000 | Kikuchi et al. ........ 375/240.18 |
| 6,359,938 B1 | * | 3/2002 | Keevill et al. ............... 375/316 |

* cited by examiner

*Primary Examiner*—Christine T. Tu
(74) *Attorney, Agent, or Firm*—Carlton H. Hoel; W. James Brady; Frederick J. Telecky, Jr.

(57) ABSTRACT

Modem selection of Reed-Solomon codeword configuration to maximize error-corrected data rate given channel analysis. A lookup table of maximal codeword size given parity bytes and channel MSE allows precomputation.

1 Claim, 2 Drawing Sheets

ERROR-CORRECTED CODEWORD CONFIGURATION AND METHOD

RELATED APPLICATIONS

This application claims priority from provisional application serial No. 60/133,365, filed May 10, 1999.

BACKGROUND OF THE INVENTION

1. Field of the Invention

The invention relates to electronic devices and communication, and more particularly to error correction coding, transmission, storage, and methods.

2. Background

Digital subscriber line (DSL) technologies provide potentially large bandwidth (e.g., up to 20 Mbps for subscribers close to the central office) for digital communication over existing telephone subscriber lines (the copper plant). Telephone subscriber lines can provide this bandwidth despite their original design for only voice band (0–4 kHz) analog communication. In particular, ADSL (asymmetric DSL) adapts to the characteristics of the subscriber line by using a discrete multitone (DMT) line code with the number of bits per tone (sub-carrier) adjusted to channel conditions as determined during training and initialization of the modems at each end of the subscriber line. Additionally, ADSL employs forward error correction coding based on Reed-Solomon codes using GF(256); the use of GF(256) permits the Galois field elements to be represented by bytes, and codewords may have up to 255 bytes. The bits of a codeword are allocated among the sub-carriers for modulation to form an ADSL symbol for transmission.

FIG. 1 shows an ADSL reference model system and FIG. 2 shows a reference transmitter model for transport of ATM data. The functional blocks may be physically performed by specialized circuitry or programmed into a digital signal processor or other processor or by a combination of such elements.

Channel analysis during training and initialization by the central office and remote site modems determines the received signal power and noise power for each upstream and downstream sub-carrier. The variables of interest are the number of bits and proportion of total power allocated to each sub-carrier. Maximize the total bit rate by choosing the values of these variables to approximately equalize the bit error rates among the sub-carriers. Then the probability of a bit error in symbol-by-symbol detection in each sub-carrier depends as usual upon the error function of the average squared distance between the constellation points and the received data points. Interleaving of the bytes prior to allocation of bits to sub-carriers will spread out burst errors.

Generally, DSL modems encounter an extremely wide range of operating conditions. It is important to determine the optimum number of Reed-Solomon parity bytes to use in order to achieve the highest possible data rate. It is also important to be able to accurately predict the performance of a given Reed-Solomon configuration in order to assess its suitability to a given set of channel conditions.

Existing approaches first assume that all Reed-Solomon configurations give similar performance, next, empirically determine the worst observed performance of those configurations that are likely to be used, and then assume this worst observed performance for all configurations.

While this will work reasonably well over a narrow range of channel conditions it does not work well over the full range of channel conditions.

SUMMARY OF THE INVENTION

The present invention provides a communication method including determination of codeword configuration (number of parity bytes and total number of bytes) for a given/detected mean squared error and a target error-corrected error rate upper bound.

This has the advantages of providing the maximum possible data rate and predictable modem performance for a given bit error rate.

BRIEF DESCRIPTION OF THE DRAWINGS

The drawings are heuristic for clarity.

DESCRIPTION OF THE PREFERRED EMBODIMENTS

1. Overview

Preferred embodiments maximize the payload bit rate for error-correcting transmission (such ADSL) under the constraint of a maximum-allowed corrected bit error rate by selection of codeword configuration. For example, ADSL transmits symbols at a constant rate (e.g., 4 kHz), and each symbol is the inverse discrete Fourier transform (IDFT) of the bits of a Reed-Solomon codeword allocated among the (32 or 256) sub-carriers for modulation. Thus with N the number of bytes in a codeword and R the number of parity bytes, the payload bit rate is the constant transmission bit rate multiplied by $(N-R)/N$. Preferred embodiments maximize $(N-R)/N$ given the constraint of a error-corrected bit error rate upper bound. Of course, as R/N increases, more errors can be corrected per codeword in order to lower the corrected bit error rate, but this decreases the payload rate.

The uncorrected bit error rate (BER) depends upon the mean squared error (MSE) which is the average squared distance between ideal constellation points and the received data. Channel analysis by the modems estimates MSE.

For a given error-corrected bit error rate upper bound plus an actual measured MSE, preferred embodiments pick codeword size (N) and number of parity bytes (R) from a lookup table in order to maximize the error-corrected payload rate. As an alternative, the computation of the best codeword size and number of parity bytes can be performed without the lookup table. Preferred embodiments provide the lookup table of codeword size (N) indexed by MSE and the number of parity bytes (R) per codeword such N is the maximum which still yields an error-corrected (by the R parity bytes) error rate no greater than the given error-corrected error rate upper bound. The lookup table can be precomputed an stored.

The codeword size lookup table may be generated as:
```
for (0 to maximum number of parity bytes)
{ for (largest mean squared error to smallest mean squared
    error)
    { compute probability of constellation error for the mean
        squared error
      for (255 to minimum length codeword)
      { if (FEC corrected error rate acceptable)
        { record codeword size
          break out of loop
        }
      }
    }
}
```

Figure 1:
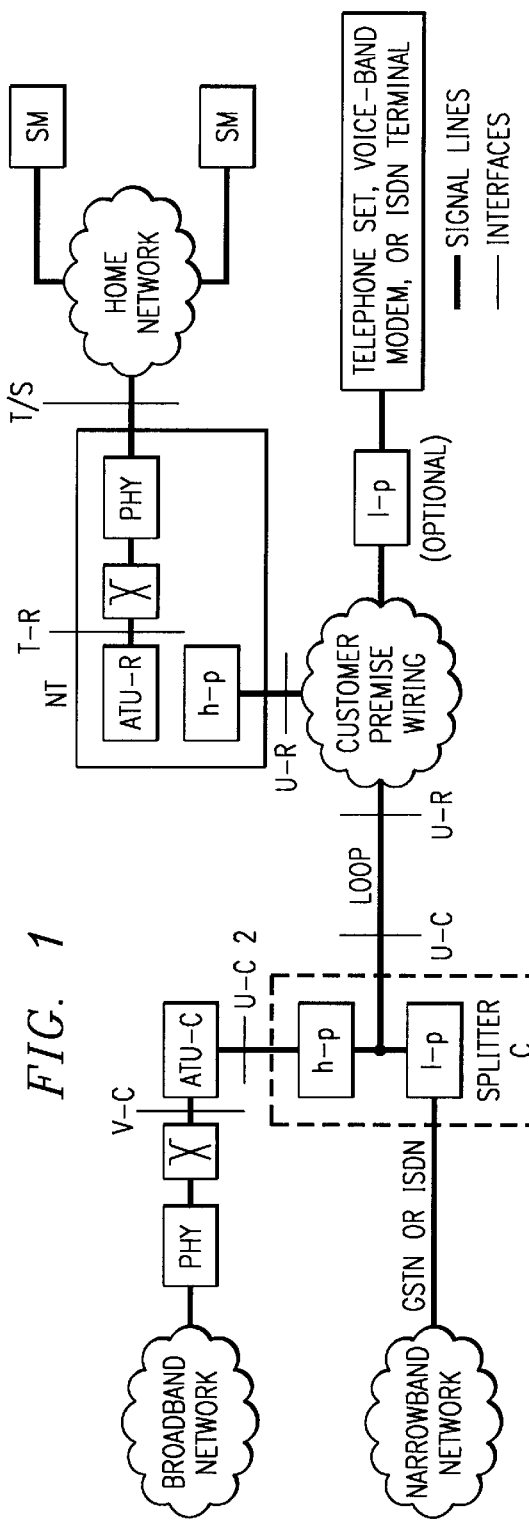
FIG. 1 illustrates an ADSL system.
Figure 2:
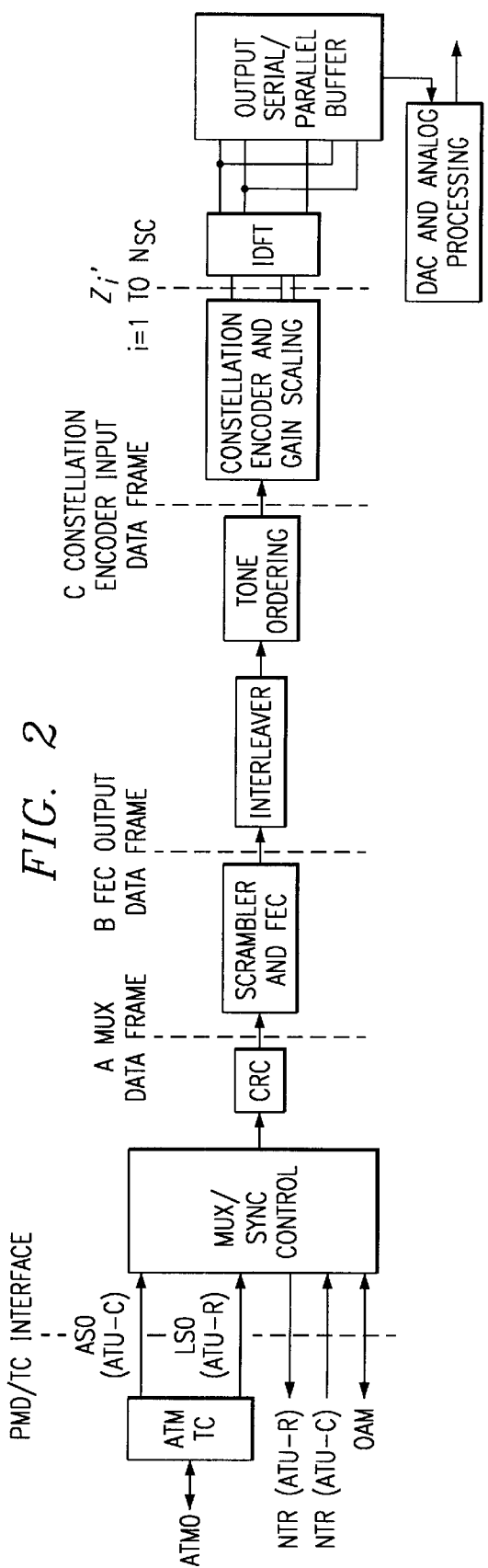
FIG. 2 is a block diagram for an ADSL transceiver transmitter for ATM data.
Figure 3:
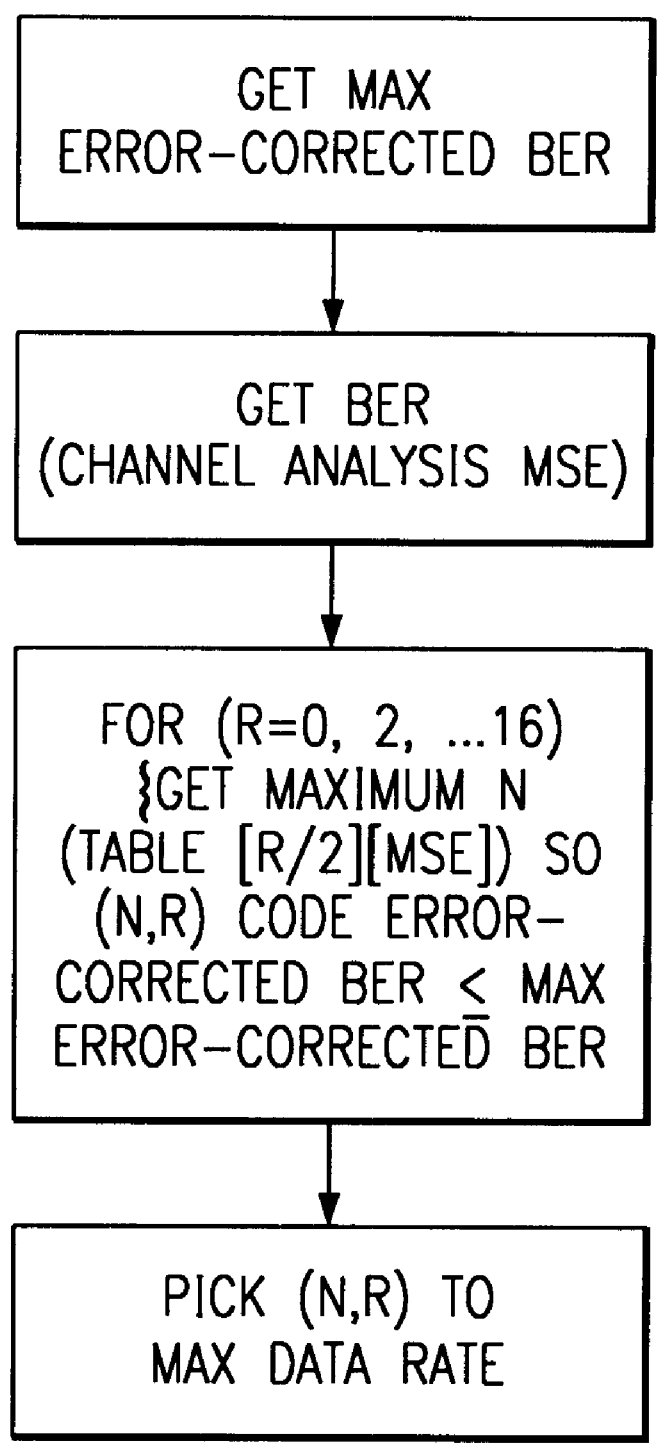
FIG. 3 is a flow diagram.

FIG. 3 illustrates the preferred embodiment flow where the table selected corresponds to the maximum error-corrected BER. For the alternative of computing N and R given MSE and error-corrected BER, essentially the table column for the given MSE is generated. Further, complications such as trellis coding and burst errors and interleaving to mitigate them leads to more involved evaluations of the codeword size for highest data rate.

2. First preferred embodiments

For ADSL or other communication systems using forward error correction block coding, the probability of X erroneous bytes in an N-byte codeword due to additive white gaussian noise may be approximated by a binomial distribution:

$$P(X)=N!/X!(N-X)!p^X q^{N-X}$$

Where p is the uncorrected byte error rate, q=1−p. Note that p equals 8 times the bit error rate (derived from MSE) if one ignores the small probability of two bit errors occurring in the same byte. Further, interleaving of bytes from various codewords essentially transforms burst errors into noise-like bit errors. Indeed, the preferred embodiments detailed below assume that error events that create multiple adjacent byte errors are the primary cause of performance deviation from the computed Reed-Solomon performance table. Since interleaving separates adjacent bytes into different Reed-Solomon codewords, the amount of interleaving present determines the extent of this effect. Reed-Solomon error correction encoding can correct R/2 bytes if the codeword has R parity bytes; for example, in ADSL a common selection is N=204, K=188, and R=16 which can correct 8 erroneous bytes per 204-byte codeword. Indeed, ADSL constrains R to be an even integer between 0 and 16 plus N is limited to 255 by use of the field GF(256). Of course, p depends upon the transmitter power, noise power, and bit rate (constellation density); and channel analysis essentially estimates p.

Thus a set of codeword size N, number of parity bytes R per codeword, and MSE (as estimated during channel analysis) determines an error-corrected error rate. If the error-corrected error rate is acceptable, then the N and R codeword configuration is usable. The preferred embodiments with a detected/given MSE maximize (N−R)/N among the usable N and R pairs to maximize the payload rate; see FIG. 3. However, the following preferred embodiment details illustrate various complications such as computations with interleaving assuming burst-type errors. In the following, the table of usable configurations is parity_tbl[ ] [ ] with array parameters "gap" (MSE) and "t" (R/2) and the table entry N. The trellis coded version is parity_trellis_tbl[ ] [ ].

The following pseudo code provides a codeword configuration method for ADSL standard with "gap" being the measured MSE from channel analysis such as during modem initialization when codeword configuration is agreed to by the modems at each end of the DSL. Note that the standard includes an option for trellis coding (using Wei's 4-dimensional trellis code) which changes the coding gain, so both options appear in the following. Similarly, both interleave and non-interleaved ("fast") coding are available in the standard.

```
The tables parity_tbl[ ] [ ] and parity_trellis_tbl[ ] [ ] are generated in
the Make-Table section following the codeword size method. Note that
these tables are generated off line in order to simplify the rate
adaptation algorithm and reduce the real time computational effort.
// For the table without trellis coding
    for (each gap to try) {
        compute probability of constellation errors from Q function
        for (all possible number of parity bytes) {
            for (max to min codeword length) {
                if (error rate after RS corrections is acceptable) {
                    record codeword length at parity_table[parity_bytes/2] [gap/
                                                                 scale_factor];
                    cycle out of loop and test a different number of parity bytes
                }
            }
        }
    }
// For the table with trellis coding
    for (each gap to try) {
        compute probability of constellation errors from tellis error rate
                estimation polynomial
        for (all possible number of parity bytes) {
            for (max to min codeword length) {
                if (error rate after RS corrections is acceptable) {
                    record codeword length at parity_table[parity_bytes/2] [gap/
                                                                 scale_factor];
                    cycle out of loop and test a different number of parity bytes
                }
            }
        }
    }
************************************************************************
For udi_c.c, the algorithm for computing 4 optimized codeword
configurations from parity_tbl[ ] [ ] or parity_trellis_tbl[ ] [ ] and some
performance measurements.
A number of data rate constraints are provided to this function that are
not part of optimizing the rate.
************************************************************************
    Select a minimum number of parity bytes based on the user provided
parameters
```

-continued

```
        (Not shown in the cut-down code)
        Select the correct parity table according to trellis decoding or not.
        The pointer "parity" is made to point to the correct table.
        Determine the latency path of the adaptive data channel. Note that
this is very DMT-ADSL specific and not relevant to the generic preferred
embodiments. However, it is needed to make sense of the code that
follows.
        Compute the number of data bytes that can be sent over one data
channel without any parity bytes. Note that the parameters provided as
input assume that only one data channel is in use. The formula is
            Adjust max_bytes for the coding gain due to trellis coding. It
might also be possible to adjust the coding gain for this factor
instead.
Adjust the data received from the ATUR as needed for high data rates.
            Note that the information is reported in a peculiar format, please
        refer to the T1.413 issue 2 standard.
        max_bits = input_bits-input_parity_bits-trellis_bits-
coding_gain_bits
            estimate: coding_gain_bits = coding_gain*tones/3dB
    for (each option to optimize)
        Adjust max_bits for a certain amount of margin, according to
            the option number.
        Enforce minimum number of parity byte rules for each data latency.
        Initialize rate optimization loop variables
            maxbytes = maxbits/8;
            adaptive data latency bytes = maxbytes-non_adaptive data latency
bytes – minumum required parity bytes
            if (trellis)
                gap = 9.8dB
            else
                gap = 5.3dB
        Setup best performance found to minimum data rate
        while (gap > the smallest gap that ever can work)
            if (host limits adaptive data rate below current)
                extra_bytes = byte capacity not allowed by the limitation
            else
                extra_bytes = -1
            repeat until break
                For the non adaptive path compute frames per codeword (fpcw)
                and codewords per frame (cwpf) with the assumption that the
                largest codeword size is best.
                Compute the allowed interleave depth based on fpcw and input
                parameters.
                Enforce rules for limitations on fpcw and interleave depth
                according to the T1.413 standard.
                Estimate the burst error coding loss as
                    loss = 1
                    if (not trellis & interleave depth is 1) loss = 2
                    if (trellis)
                        interleave depth = 1 => loss = 8
                        interleave depth = 2 => loss = 4
                        interleave depth = 4 => loss = 2
                if (parity or adaptive bytes available out of range) quit
                t = parity bytes per codeword/(loss*2)
                t is the effective correcting power of the proposed RS
codeword
                if parity_table[gap] [t] < non_adaptive_codeword_length
                    add a parity byte
                    subtract a byte from the adaptive path
                else
                    break out of loop
            END OF REPEAT UNTIL BREAK
            if (extra_bytes < 0) // some parity needed in adaptive path
                // Figure out the needed number of parity bytes
                for (t ranging from min to max)
                    if (parity_table[gap] [t] >= adaptive_codeword_length)
                        break out of loop
            else
                t = 0
            if (t<=max) & (net adaptive data rate is higher than best
encountered)
                record the current RS configuration as the best encountered
                configuration and data rate
        Increase maxbytes by 1
        Decrease the gap accordingly
            gap = gap – 8bits/(tones*3dB)
            // Make gap computation numerically stable for fixed point
            // by changing the units and also computing
            // current_gap = start_gap – 8bits (currentbytes–
```

```
            startingbytes)/(tones*3dB)
                END OF WHILE GAP IN RANGE
                Re-enforce user supplied data maximums
                Record the optimum adaptive and non-adaptive RS configuration to
                CRatesRA string.
            END OF FOR EACH OPTION
END OF FUNCTION
*************************************************************************
The following code determines the correct option to use from a group of
4 supplied options. This requires evaluating the performance of the
supplied RS configurations and determining the highest data rate that
matches the current conditions.
*************************************************************************
        Determine the number of bytes needed for each latency path for each
        option
        Determine the correct parity_tbl to use, based on trellis decoding or
not
        for each option
// Compute gap for fast latency path followed by
// computing gap for interleave latency path
// Note trick used to compute correct correcting power.
            required gap = min gap
            if trellis enabled
                correcting power = (parity bytes per codeword)/16
            else
                correcting power = (parity bytes per codeword)/4
            for (each latency path)
                for (min to max coding gap)
                    if (parity_tbl[correcting power] [gap] >= codeword size
                        break out of loop
                if (min gap > required gap) required gap = min gap
// Compute gap for interleaved latency path
            if trellis enabled
                if (interleave depth >= 8) correcting power = (parity bytes per
                                                                  codeword)/2
                if (interleave depth == 4) correcting power = (parity bytes per
                                                                  codeword)/4
                if (interleave depth == 2) correcting power = (parity bytes per
                                                                  codeword)/8
                if (interleave depth == 1) correcting power = (parity bytes per
                                                                  codeword)/16
            else
                if (interleave depth >= 2) correcting power = (parity bytes per
                                                                  codeword)/2
                else correcting power = (parity bytes per codeword)/4
//
        END FOR EACH LATENCY PATH
        Call function to compute bit capacity at required gap
        Add in additional bits required for trellis
        if sufficient bit capacity
            break out of loop
        END FOR EACH OPTION
        return last tested option number
        Note that this will return option 4 if no option can be supported by
        the channel.
Make Table generates parity_tbl[ ] [ ] and parity_trellis_tbl[ ] [ ]:
#include "stdio.h"
#include "stdlib.h"
#include "math.h"
#include "typedefs.h"
// Gamma functions and erf taken from "Numerical Recipies" in Fortran
// and translated to c
double gammln (double xx) {
state double cof[6]={76.18009173, -86.50532033, 24.01409822,
-1.231739516,
                    0.120858003e-2, -0.536382e-5 };
static double stp = 2.50662827465;
double x,tmp,ser;
int i;
    x = xx-1.0;
    tmp = x+5.5;
    tmp = (x+0.5)*log(tmp)-tmp;
    ser = 1.0;
    for (i=0;i<6;i++) {
        x += 1.0;
        ser = ser+cof[i]/x;
    }
    return tmp+log(stp*ser);
}
```

-continued

```
double gser(double a, double x) {
double gln,ap,sum,del;
int i;
    gln = gammln(a);
    if (x==0) return 0;
    ap = a;
    sum = 1.0/a;
    del = sum;
    for (i=0;i<100;i++) {
        ap += 1.0;
        del *= x/ap;
        sum += del;
        if (fabs(del) < (fabs(sum)*3.0e-7)) break;
    }
    return sum*exp(-x*a*log(x)-gln);
}
double gcf(double a, double x) {
double gln, gold, a0,a1,b0,b1,fac,an,ana,anf,g;
int i;
    gln = gammln(a);
    gold = 0;
    a0 = 1.0;
    a1 = x;
    b0 = 0;
    b1 = 1;
    fac = 1.0;
    for (i=0;i<100;i++) {
        an = i+1;
        ana = an-a;
        a0 = (a1+a0*ana)*fac;
        b0 = (b1+b0*ana)*fac;
        anf = an*fac;
        a1 = x*a0+anf*a1;
        b1 = x*b0+anf*b1;
        if (a1 != 0) {
            fac = 1.0/a1;
            g = b1*fac;
            if (fabs((g-gold)/g) < 3e-7) break;
            gold = g;
        }
    }
    return exp(-x+a*log(x)-gln)*g;
}
double gammp(double a, double x) {
double gammp;
    if (x < (a+1)) {
        gammp = gser(a,x);
    } else {
        gammp = 1.0-gcf(a,x);
    }
    return gammp;
}
double erf(double x) {
double ret;
    ret = gammp(0.5,x*x);
    if (x < 0) ret = -ret;
    return ret;
}
// This function computes the probability of a decision error
// in decoding a square grid 2 dimensional constellation, given
// a particular gap allowance.
float pe2d(double gapdB) {
double x,y;
// 2D symbol error rate = 4*Q(sqrt(3*gap))
    x = sqrt(3*pow(10,(gapdB/10.0)));
// the follwing is the Q-function
    y = 0.5*(1.0-erf(x/sqrt(2.0)));
// use factor of 4 for 2D error rate (bit error rate
// is often approximated as ½ 2D error rate)
    return 4.0*y;
}
/* Function that produces the output 2D error rate given an input gap.
Note that the gap already takes into account any loss due to the
constellation expansion and overhead bits required to force the trellis
to state 0 */
float wei_pe2d(double gapdB)
{
            double wei_poly[6] = {1.3747e-004, -1.0089e-002, 2.6025e-001,
                    -3.2422e+000, 1.8473e+001, -3.9105e+001};
```

-continued

```
                double snrdB;
                double y;
                int i;
                /* The polynomial was computed with the 1.5 dB penality for
                constellation expansion. This must be removed. In addition,
                the polynomial wants the normalized SNR, which is 3 * gap. */
                snrdB = 10*log10(3.0) + gapdB + 1.5;
                /* evaluate the polynomial to obtain log of the error rate */
                y = 0.0;
                for (i = 0; i < 6; i++)
                        y = y*snrdB + wei_poly[i];
                /* return error rate */
                return(pow(10.0, y));
}
// This function computes the output byte error rate of a
// Reed-Solomon decoder given the input byte error rate (p), the
// codeword length (n), and the correction power (t).
double Out_Byte_Err_Rate(int n, int t, double p) {
int i;
double term[256];
double factor,sum;
                factor = p/(1.0-p);
                term[0] = p * exp((double) (n-1) * log(1.0-p));
                for (i=1;i<n;i++) {
                term[i] = term[i-1] * factor * (double) (n-i) / (double) i;
                }
                sum = 0.0;
                for (i=t;i<n;i++) {
                sum += term[i];
                }
                return(sum);
}
// This is the main routine. It prints a table of numbers that can
// be used by the optimized rate adaptation to compute the optimum
// number of parity bytes per codeword.
main (int argc,char **argv) {
short i,shift,bit;
double x;
int t,max_bytes;
double correrr,gapdB,rawerr;
// Offline computation of 400 byte table used to determine if a
situation gives
// an adequate BER or better no trellis
// This generates a table needed by the compacted optimum point search
        printf("unsigned char
parity_tbl[%d] [%d]={\n", (MAX_PARITY_CW/2)+1, ((MAX_GAP-
MIN_GAP)/GAP_TABLE_SCALE)+1);
        for (t=0;t<=MAX_PARITY_CW;t+=2) {
                for (gapdB=(MIN_GAP);gapdB<=(MAX_GAP);gapdB+=GAP_TABLE_SCALE) {
                        if (!((t==0) && (gapdB==MIN_GAP))) printf(", ");
                        else printf(" ");
                        rawerr = pe2d(10.0*log10(2.0)*gapdB/256.0);
// Hunt for the maximum number of data bytes that give 2E-7 byte error
rate
                        for (max_bytes=255;max_bytes >= t+1;max_bytes--)
                                if ((correrr = Out_Byte_Err_Rate(max_bytes,t/2,rawerr)) < (2e-
7)) break;
                        if (correrr >= 2e-7) max_bytes = 0;
                        printf ("%3d",max_bytes);
                }
                printf("\n");
        }
        printf("}; \n");
// Offline computation of 400 byte table used to determine if a
situation gives
// an adequate BER or better with trellis
// This generates a table needed by the compacted optimum point search
        printf("unsigned char
parity_trellis_tbl[%d] [%d]={\n",(MAX_PARITY_CW/2)+1,((MAX_GAP-
MIN_GAP)/GAP_TABLE_SCALE)+1);
    for (t=0;t<=MAX_PARITY_CW;t+=2) {
        for (gapdB=(MIN_GAP);gapdB<=(MAX_GAP);gapdB+=GAP_TABLE_SCALE) {
            if (!((t==0) && (gapdB==MIN_GAP))) printf(", ");
            else printf(" ");
            rawerr = wei_pe2d(10.0*log10(2.0)*gapdB/256.0);
// Hunt for the maximum number of data bytes that give 2E-7 byte error
rate
            for (max_bytes=255;max_bytes >= t+1;max_bytes--)
                if ((correrr = Out_Byte_Err_Rate(max_bytes,t/2,rawerr)) <
```

-continued

```
                if (correrr >= 2e-7) max_bytes = 0;                               (2e-7)) break;
                printf("%3d",max_bytes);
        }
            printf("\n");
        }
    printf(""); \n");
    exit(0);
}
UDI
// Table for evaluating the performance of various numbers of parity
// bytes per codeword
// The following parameters are all in units of 256*log2(power)
#define MIN_GAP              49     // Smallest gap that can ever give a
connection
#define MAX_GAP              849    // Large enough gap to not require
parity
#define GAP_TABLE_SCALE      16     // Scale factor for gap table
#define GAP_TABLE_W          51     // Width of gap_table is 51 columns
#define NOMGAPDB_TRELLIS     385    // Gap if trellis is on and zero parity
unsigned char parity_tbl[9] [51]={
  0, 0, 0, 0, 0, 0, 0, 0, 0, 0, 0, 0, 0, 0, 0, 0, 0, 0, 0, 0, 0, 0, 0,
  0, 0, 0, 0, 0, 0, 0, 0, 0, 0, 0, 0, 0, 0, 0, 0, 0, 0, 0, 0, 0, 0, 0,
  0, 255, 255,
  0, 0, 0, 0, 0, 0, 0, 0, 0, 0, 0, 0, 0, 0, 0, 0, 0, 0, 0, 0, 0, 0, 0,
  0, 0, 0, 0, 0, 0, 0, 0, 0, 0, 3, 5, 9, 18, 37, 81, 185, 255, 255, 255, 255,
  255, 255, 255, 255, 255, 255, 255,
  0, 0, 0, 0, 0, 0, 0, 0, 0, 0, 0, 0, 0, 0, 0, 0, 0, 0, 0, 0, 0, 0, 0,
  0, 5, 7, 9, 13, 20, 30, 46, 73, 118, 195, 255, 255, 255, 255, 255, 255,
  255, 255, 255, 255, 255, 255, 255, 255, 255, 255,
  0, 0, 0, 0, 0, 0, 0, 0, 0, 0, 0, 0, 0, 0, 0, 0, 0, 0, 0, 8, 9, 12,
  15, 20, 27, 37, 51, 73, 104, 152, 226, 255, 255, 255, 255, 255, 255,
  255, 255, 255, 255, 255, 255, 255, 255, 255, 255, 255, 255, 255,
  0, 0, 0, 0, 0, 0, 0, 0, 0, 0, 0, 0, 0, 0, 0, 0, 9, 11, 13, 16, 20, 26,
  33, 42, 55, 73, 99, 135, 188, 255, 255, 255, 255, 255, 255, 255,
  255, 255, 255, 255, 255, 255, 255, 255, 255, 255, 255, 255, 255, 255,
  0, 0, 0, 0, 0, 0, 0, 0, 0, 0, 0, 0, 0, 11, 13, 15, 18, 22, 26, 32, 40,
  50, 64, 82, 107, 142, 189, 255, 255, 255, 255, 255, 255, 255, 255, 255,
  255, 255, 255, 255, 255, 255, 255, 255, 255, 255, 255, 255, 255,
  255,
  0, 0, 0, 0, 0, 0, 0, 0, 0, 0, 0, 14, 16, 18, 21, 25, 30, 36, 44, 53, 66,
  83, 105, 135, 175, 229, 255, 255, 255, 255, 255, 255, 255, 255, 255,
  255, 255, 255, 255, 255, 255, 255, 255, 255, 255, 255, 255, 255,
  255, 255,
  0, 0, 0, 0, 0, 0, 0, 0, 0, 16, 18, 20, 23, 27, 32, 37, 44, 53, 64, 79,
  98, 122, 154, 197, 254, 255, 255, 255, 255, 255, 255, 255, 255, 255,
  255, 255, 255, 255, 255, 255, 255, 255, 255, 255, 255, 255, 255,
  255, 255, 255,
  0, 0, 0, 0, 0, 0, 0, 0, 17, 19, 22, 24, 28, 32, 37, 43, 51, 61, 73, 88,
  108, 134, 167, 210, 255, 255, 255, 255, 255, 255, 255, 255, 255, 255,
  255, 255, 255, 255, 255, 255, 255, 255, 255, 255, 255, 255, 255,
  255, 255, 255, 255,
};
unsigned char parity_trellis_tbl[9] [51]={
  0, 0, 0, 0, 0, 0, 0, 0, 0, 0, 0, 0, 0, 0, 0, 0, 0, 0, 0, 0, 0, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  0, 0, 0, 0, 0, 0, 0, 0, 0, 0, 0, 5, 19, 75, 255, 255, 255, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  255, 255, 255, 255,
  0, 0, 0, 0, 0, 0, 0, 6, 14, 33, 84, 223, 255, 255, 255, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  255, 255, 255, 255, 255,
  0, 0, 0, 0, 0, 9, 17, 34, 73, 165, 255, 255, 255, 255, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  255, 255, 255, 255, 255, 255,
  0, 0, 0, 9, 14, 24, 46, 91, 190, 255, 255, 255, 255, 255, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  255, 255, 255, 255, 255, 255,
  0, 0, 11, 16, 27, 48, 89, 175, 255, 255, 255, 255, 255, 255, 255,
  255, 255, 255, 255, 255, 255, 255, 255, 255, 255, 255, 255, 255, 255,
  255, 255, 255, 255, 255, 255, 255, 255, 255, 255, 255, 255, 255, 255,
  255, 255, 255, 255, 255, 255, 255,
  0, 0, 17, 27, 44, 78, 146, 255, 255, 255, 255, 255, 255, 255, 255,
  255, 255, 255, 255, 255, 255, 255, 255, 255, 255, 255, 255, 255, 255,
```

-continued

```
255, 255, 255, 255, 255, 255, 255, 255, 255, 255, 255, 255, 255, 255,
255, 255, 255, 255, 255, 255, 255,
0, 17, 25, 39, 66, 116, 213, 255, 255, 255, 255, 255, 255, 255,
255, 255, 255, 255, 255, 255, 255, 255, 255, 255, 255, 255, 255, 255,
255, 255, 255, 255, 255, 255, 255, 255, 255, 255, 255, 255, 255, 255,
255, 255, 255, 255, 255, 255, 255, 255,
17, 23, 34, 54, 90, 158, 255, 255, 255, 255, 255, 255, 255, 255,
255, 255, 255, 255, 255, 255, 255, 255, 255, 255, 255, 255, 255, 255,
255, 255, 255, 255, 255, 255, 255, 255, 255, 255, 255, 255, 255, 255,
255, 255, 255, 255, 255, 255, 255, 255,
};
unsigned char *parity;
struct
{
    struct
    {
        UCHAR up_latency;
        UCHAR down_latency;
    } option [4];
} modem_latency [MAX_MODEMS];
//**************************************************************
//CalcNum_U
//Given the maximum number of downstream bytes, calculates the number of
//actual data bytes by subtracting the number parity bytes, the number
// of overhead bytes and the number of bytes in the channel with
// constant values for the four options. For both the downstream and
// upstream cases, any of the channels can contain data that is varying
// among the options, but only one channel in each direction can be
// varying. Input data: Number of maximum downstream bytes, fast and
// interleaved arrays.
//Output data: Number of actual data bytes for the downstream channels.
//**************************************************************
void CalcNum (int maxbits,     // maxbits per symbol reported by modem
              int R,           // number of parity bytes needed for maxbits
              int K,           // user bytes/codeword for maxbits
              int tones,       // number of active tones for maxbits
              int gain,        // coding gain assumed for maxbits
              int hostmin,         // minimum data rate requirement
              int hostmax,         // maximum data rate limit
              UCHAR *pCRates1,     // DMT-ADSL CRates1 string to compute
              int *varying,        // data channel number to adapt
              int latency,         // target latency in frames
              int redovrhd,        // flag for framing mode
              int datadrvn,        // flag for framing mode
              int updwn,           // upstream/downstream flag
              int trellis,         // trellis algorithm also active
              )
{
    int numbyte, totbyte[2], i, j, D, chan, tidx, tmaxbyte, offset;
    int temptobyte[2],parbyte[2],fpcw[2],cwpf[2], minpar[2], N[2];
    int maxtemptotbyte,maxtempparbyte[2],maxtempfpcw,maxtempcwpf,maxDepth;
    int current_gap,fail,t,maxbytes,start_gap,startbytes, maxadjbits;
    int trellis_bits, trellis_gain;
    int extra_bytes,maxtempD,flag;
// Choose the minimum number of parity bytes.
    minpar[0] = MinParF;
    if (latency == LowLatency)
        minpar[1] = MinParL;
    else
        minpar[1] = MinParH;
// Check to see if fast or interleave path is varying.
    if (*varying >= 10) j=1;
    else{
        j=0;
        if (hostmax > 255)    // If fast path varying fix hostmax = 255.
            hostmax = 255;
    }
// Now that we have the fixed number of user bytes in each path, we
// need to add in the overhead bytes, since these also need parity
// protection.
    if (redovrhd) {
        if (!datadrvn || totbyte[j^1]) totbyte[j^1]++;
        totbyte[j]++;
    } else {
        if (updwn) {
            if (totbyte[j^1]) totbyte[j^1]+=3; else totbyte[j^1]++;
            totbyte[j] += 3;
        } else {
            if (totbyte[j^1]) totbyte[j^1]+=2; else totbyte[j^1]++;
```

-continued

```
            totbyte[j] += 2;
        }
    }
// Find the penalty factor to be used for fast path.
    if (!trellis)
        N[0] = 1;
    else
        N[0] = 3;
// Next we need to estimate the parity-less maximum data rate.
// We use gain to compute the margin that
// we would have had with no parity. Then we estimate the maximum
// bit rate that can be supported with a 0 margin given the value
// of tones. This give us our starting point for finding the
// optimum parity assignment.
// The parity-less data rate is tmax = maxbits−R*8
// The parity-less margin at that data rate is −gain
// The data rate with 0 margin is about tmax − (gain/3)*tones
// A more accurate computation is possible, but not necessarily
// constructive. gain is in units of 2* dB. But before all this we
// need to take care of the gain that we get if trellis is on. Hence do
// that first.
    if (trellis) {
        if (tones !=0) {
            trellis_bits = ((tones+1)>>1) + 4;
            if (updwn) {
                trellis_gain = (MAX_GAP − NOMGAPDB_TRELLIS) −
(256*trellis_bits)/tones;
                maxbits += (trellis_gain*tones)/256;
            }
            maxbits −= trellis_bits;
        }
    }
// Check if S=½ in RMSGSRA
    if (updwn && (((maxbits/8)−K) > R))
        R *= 2;                            // Make R as parity per symbol
        maxbits −= ((R*8) + ((gain*tones)/6));
        if (tones == 0) tones = 1; // To prevent divide by zero
// Find the four options optimally
    for (i=0; i<4; i++) {
// Adjust the gain for options 0, 2 and 3 as compared to option 1 so
// as to get a better spread of rates that takes into account slight
// inaccuracies that we may have in estimating the maxbits above. This
// also gives us a better changes of connecting to the ATUR modem.
        maxadjbits = maxbits − ((i−1)*MarginAdj*tones)/6;
        if (maxadjbits < 0) maxadjbits = 0;
// Now we are ready to try adding user bytes one at a time and
// searching for acceptable numbers of parity bytes. This must
// make sure that both latencies have enough parity to have a
// valid margin.
// First we should add in any bytes that are possible with minimum
// parity and no assumed gain. This is only needed to reduce the
// compute time
// This needs to account for the need to add parity to any path in
// use. Assume min parity bytes on each path.
        temptotbyte[0] = totbyte[0];
        if (totbyte[0] > 0) parbyte[0] = minpar[0]; else parbyte[0]= 0;
        temptotbyte[1] = totbyte[1];
        if (totbyte[1] > 0) parbyte[1] = minpar[1]; else parbyte[1]= 0;
        maxbytes = maxadjbits >> 3;
        temptotbyte[j] = maxbytes − temptobyte[j^1]−parbyte[j^1]−
                                                    parbyte[j];
        current_gap = MAX_GAP;
        if (trellis) current_gap = NOMGAPDB_TRELLIS;
        start_gap = current_gap;
        startbytes = maxbytes;
// Preset the optimum rate values to anything sensible
        maxtemptotbyte = −32768;
        maxtempparbyte[0] = parbyte[0];
        maxtempparbyte[1] = parbyte[1];
        maxtempfpcw = 1;
        maxtempcwpf = 1;
        maxtempD = 1;
// ************************
// Main rate adaptation loop
// ************************
// Keep adding bytes and decreasing the gap until the gap is too
// low to possibly work.
        while(current_gap >= MIN_GAP) {
// First we determine the frames per codeword in the interleave path
```

-continued

```
// and the codewords per frame in the fast and interleave path
// Then we determine if the non-adaptive path has enough parity. If not,
// we steal a byte or two bytes from the adaptive path and cycle.
// Otherwise we continue and determine the number parity bytes required
// in the adaptive path and the resultant data rate. If the resultant
// data rate is an improvement, record that fact and cycle.
// extra_bytes store the amount of bytes that the channel can support
// before we need to start stealing the bytes as mentioned above. Only
// if this goes to zero do we need to start stealing bytes from adaptive
// path. If the channel can support hostmax with the min parity bytes
// then no need to loop. Quit in one iteration.
                flag = 0;
                extra_bytes = 0;
                if ((temptobyte[j] − totbyte[j]) >= hostmax) {
                        extra_bytes = temptotbyte[j] − totbyte[j] − hostmax;
                        temptotbyte[j] = hostmax + totbyte[j];
                        flag = 1;
                }
                if (!flag) extra_bytes = −1; // Need to start stealing.
                fail = 0;
// Loop for non-adaptive path. In this path the number of user bytes is
// fixed, so the codeword length increases by adding parity bytes until
// a useable configuration is reached.
                while (1) {
                        fpcw[0] = 1;
                        if ((temptotbyte[0]+parbyte[0]) < 256) {
                                cwpf[0] = 1;
                        } else {
                                cwpf[0] = 2;
                        }
// Compute the number of frames per codeword. Assume that the largest
// value is always best. An additional loop could be added to test all
// possible values of S to determine which yields the best data rate,
// but this would rarely improve things.
                        if ((temptotbyte[1]+parbyte[1]) < 256) {
// Slightly odd arithmetic used to avoid a divide so that this never
// tries to divide by zero
                                if (((temptotbyte[1]+parbyte[1]) * latency) < 255)
                                        fpcw[1] = latency;
                                else
                                        fpcw[1] = 255/(temptotbyte[1]+parbyte[1]);
// CheckPowerofTwo returns the largest power of two that is less than or
// equal to the input.
                                fpcw[1] = CheckPowerOfTwo(fpcw[1]);
// Force D>1 if S>1
                                D = latency/fpcw[1];
                                if (D == 1) {
                                        if (fpcw[1]>=2) {
                                                fpcw[1] = fpcw[1]>>1;
                                                D = latency/fpcw[1];
                                        }
                                }
// Check for max S and D. This is a bare minimum code with some
// assumptions. The latency should be a multiple of 2 and less than
// 64.
                                if (updwn)
                                        maxDepth = MaxUSDepth;
                                else
                                    maxDepth = MaxDSDepth;
                                if (fpcw[1]>16)      // Occurs for both US and DS at low rates
                                                                          for highlatency
                                        fpcw[1] = 16;
                                else if (D>maxDepth) // Occurs for US at high rates
                                                                              (S=4, D=16)
                                        fpcw[1] = latency/maxDepth;
                                cwpf[1] = 1;
                        } else { // if less than 256 bytes per frame
                                cwpf[1] = 2;
                                fpcw[1] = 1;
                        }
// Compute the interleave depth. Force the overall latency to the
// desired value given the computed number of frames per codeword above.
                        D = latency/fpcw[1];
// Find the penalty factor for interleave path.
// A first order approximation that the correcting power of Reed-Solomon
// codes is divided by any predominant codeword multi-byte error length.
//
// For non-trellis, it is assumed that a constellation error can cause
// 2 Reed-Solomon bytes in error. The interleaver will separate these
```

-continued

```
// bytes. Thus, for interleave depths of 1 it is assumed that the RS
// correcting power is halved.
//
// For trellis, it is assumed that typically 8 consecutive bytes will
// be affected by each trellis decode error. Thus, for interleave
// depths of 1 it is assumed that the RS correcting power is reduced by
// 8, for interleave depths of 2 it is assumed that the RS correcting
// power is reduced by 4, etc.
//
// Rather than use an expensive to compute divide, we take advantage of
// the power of two nature of the above and use a right shift. The
// denominator is expressed as the exponent of a power of two.
            N[1] = 0;
            if (trellis) {
                if (D == 1)       N[1] = 3;
                else if (D == 2)  N[1] = 2;
                else if (D == 4)  N[1] = 1;
            } else {
                if (D == 1)       N[1] = 1;
            }
// Quit if zero data bytes are available
                    if (!temptotbyte[j^1]) break;
// Compute the currently selected correcting power
                    t = parbyte[j^1]*fpcw[j^1]/(2*cwpf[j^1]);
// Check for not possible to make the non-adaptive latency path function
// at the current gap. Stop adapting.
                    if (t > 8) { // Cannot support this much parity. Allocation
failure
                        fail = 1;
                        break;
                    } else {
// Now we are ready to check if the non-adaptive path has enough parity
// In this case we have a fixed number of user bytes and want to add
// parity until
//
                        if (*(parity + GAP_TABLE_W*(t>>N[j^1]) + (current_gap-
                                                      MIN_GAP)/GAP_TABLE_SCALE) <
(((temptotbyte[j^1]+parbyte[j^1])*fpcw[j^1])/cwpf[j^1])) {
                            parbyte[j^1]++;
// Check for not enough parity in the non-adaptive path! Steal a byte
// from the adaptive path and cycle
                            if (extra_bytes<=0) temptotbyte[j]--;
                            extra_bytes--;
                        }
                        else
// Found a configuration that works, escape out of the loop
                            break;
                    }
            } // while(1)
            if (fail) break; // Fixed rate path failed, quit now.
// Now we need to determine the minimum number of parity bytes required
// to support the remaining data, which will all be allocated to the
// adaptive latency path. Unlike the above, this is with a fixed number
// of bytes per frame = temptotbyte[j]+parbyte[j]
// If the number of bytes for the varying channel is not limited by the
// maximum allowed data rate, compute what codeword configuration can be
//used. Otherwise use 0 parity bytes.
            if (extra_bytes<=0) {
                if ((temptotbyte[j]+parbyte[j]) > 0) {
// Search for a useable RS codeword configuration
                    for (t= ((minpar[j]+(minpar[j]&1))/2); t<9; t++)
                        if (*(parity + GAP_TABLE_W*(t>>N[j]) + (current_gap-
MIN_GAP)/GAP_TABLE_SCALE) >=
                                (((temptotbyte[j]+parbyte[j])*fpcw[j])/cwpf[j])) break;
// If a valid codeword was found, compute the resulting number of parity
// and data bytes
                    if (t < 9) {
                        parbyte[j] = (t*cwpf[j]*2 + fpcw[j]-1/fpcw[j];
                        temptotbyte[j] = maxbytes-parbyte[j]-temptotbyte[j^1]-
parbyte[j^1];
                    }
                }
            }
            else
                    t = 0;
// if t is 9, then we could not make it work. Higher data rates might
// work if it changes the number of codewords per frame or frames per
// codeword, so cycle. Check to see if this gives our best data rate
            if ((t<9) && ((temptotbyte[j]+parbyte[j])>0)) {
```

-continued

```
                if ((temptotbye[j] > 0) && (temptotbyte[j] > maxtemptotbyte))
{
                        maxtemptotbyte = temptotbyte[j];
                        maxtempparbyte[0] = parbyte[0];
                        maxtempparbyte]1] = parbyte[1];
                        maxtempfpcw = fpcw[1];
                        maxtempcwpf = cwpf[1];
                        maxtempD = D;
                }
        }
// If already greater than hostmax break.
            if ((temptotbyte[j] - totbyte[j]) >=hostmax) break;
// If not add a byte, update the margin and try again
            maxbytes++;
            temptotbyte[j]++;
// First estimate the gap for the new number of bytes allocated
// Simply approximate 3dB*bit/tone
            current_gap = start_gap - (256*8*(maxbytes-startbytes))/tones;
        } // while (current_gap >= MIN_GAP)
// Enforce user supplied maximum and minimum
        if ((maxtemptotbyte-totbyte[j]) < hostmin) {
            maxtemptotbyte = hostmin+totbyte[j];
        }
        if ((maxtemptotbyte-totbyte[j]) > hostmax) {
            maxtemptotbyte = hostmax+totbyte[j];
        }
// Now write our selected configuration to CRATES1, option i
// Set the adaptive rate channel
        maxbytes = maxtemptotbyte-totbyte[j];
        if (*varying != 10) {
            if (maxbytes > 255) pCRates1[i*30+(*varying)] = 255;
            else pCRates1[i*30+(*varying)] = maxbytes;
        } else {
            pCRates1[i*30+(*varying)] = maxbytes;
            maxtempparbyte[1] |= (maxbytes & 0x100) >> 1;
        }
// Set the number of parity bytes
        if (!updwn) offset = 5;
        else offset = 0;
        pCRates1[i*30+20+offset] = maxtempparbyte[0];
// Set S and R interleave
        if (maxtempcwpf > 1) {
            pCRates1[i*30+22+offset] = 0;
            maxtempparbyte[1] += ((-maxtempparbyte[1]) & 0x3);
        }          else {
            pCRates1[i*30+22+offset] = maxtempfpcw;
            if (maxtempfpcw == 1) {
                maxtempparbyte[1] += (maxtempparbyte[1] & 0x1);
                if ((maxtempparbyte[1] + maxtemptotbyte) > 255) {
                    maxtempparbyte[1] += ((-maxtempparbyte[1]) & 0x3);
                    pCRates1[i*30+22+offset] = 0;
                }
            }
        }
        pCRates1[i*30+21+offset] = maxtempparbyte[1];
// Set D
        pCRates1[i*30+23+offset] = maxtempD;
        }   // end for i
}
// Example function for using parity_table[ ] to compute supportable data
// rates. This is the final step of optimized rate adaptation.
//
//*********************************************************************
        extern unsigned char parity_tbl[9] [GAP_TABLE_W];
        extern unsigned char parity_trellis_tbl[9] [GAP_TABLE_W];
//*********************************************************************
// Function:               Rcv_SelectOption_C( )
//
// Purpose:
//     Computes the required gap for the given margin, codeword size and
// number of parity bytes.
//     Separately computes the required gap for fast and interleave paths
// and uses the larger value, thus supporting dual latency.
//     Allocates bits at each minimum gap to determine if the channel
// capacity is sufficient for that option number.
//
//                         This function has been stripped down to its essentials
//*********************************************************************
short Rcv_SelectOption_C(        short SNR[ ],
```

-continued

```
                            short trellis,
                            short target_margin,
                unsigned char *CRates1,
                int *desired_bits,
                unsigned char *rcv_nbits,
                short *req_gap)
{
        int totalbytes[2] [ MAXNUMRATES ],temptot;  // array of total bits for each option
        int ncar;                  //       bit_dist needs them to store data
        int i,s,mingap,testgap,N,t,D,cwpf;          // general index
        int trellis_bits;          // Additional bits in case of trellis coding
        int option;                //If none of the totalbits for each option
                                   //is less than the maximum bits, an
                                   //invalid value is returned indicating it failed
        unsigned char *parity;
        ParseCRates1( CRates1, totalbytes );        //decodes total bits for each
                                                    // option from CRates1 message
        if (trellis)
            parity = &(parity_trellis_tbl[0] [0]);
        else
            parity = &(parity_tbl[0] [0]);
// Now test each option to determine if any of them will work
        for (option = 0; option < MAXNUMRATES; option++) {
            // determine what forces a minimum gap, fast or interleave data
            // In the fast path the effective correcting capacity of FEC is
            // halved without trellis and ⅛ with trellis due to error
            // correlations
            N = 1;
            if (trellis) N = 3;
            mingap = MIN_GAP;   // Start out with the best case scenario
            s = 1;
            for (i=0;i<2;i++) {
                temptot = s*totalbytes[i] [option];
                if ((temptot > 255) || (s==0)) cwpf = 1; else cwpf = 0;
                t = (CRates1[30*option+25+i] * s) >> (N+1+cwpf);
                for (testgap=0;testgap<GAP_TABLE_W;testgap++) {
                    if (*(parity + t*GAP_TABLE_W + testgap) >= ((temptot+cwpf)>>cwpf))
                        break;
                }
                testgap = testgap*GAP_TABLE_SCALE + MIN_GAP;
                if (testgap > mingap) mingap = testgap;
                if (i == 0) {
                // Find the penalty error correlation for the interleave path
                    s = CRates1[30*option+27];
                    if (s==0) s = 1;
                    D = CRates1[30*option+28];
                    N = 0;
                    if (atur_msg->trellis) {
                        if (D == 1)        N = 3;
                        else if (D == 2)   N = 2;
                        else if (D == 4)   N = 1;
                    }
                    else{
                        if (D == 1)        N = 1;
                    }
                }
            }
            MaxBits_per_frame(SNR,                          // call Rcv_BitDist_C
with target margin to
                              LOST_MARGIN+mingap+target_margin,       //
                can be allocated at the target
                              rcv_nbits,              //        margin specified
in atur_msg
                              &ncar);
// Add trellis bits if necessary
            if ( trellis ) {
                trellis_bits = ( ncar + 1 ) >> 1;
                if (ncar) trellis_bits += 4;
            } else {
                trellis_bits = 0;
            }
            temptot = (totalbytes[0] [option]+totalbytes[1] [option])*8;
            if (rcv_nbits >= (temptot + trellis_bits)) break;
        }
        return( option );
}
```

3. The Preferred Embodiment Methods in General

The preferred embodiments use several components together as follows.

1) An approximation of the margin cost function for adding data bits or bytes to the transmission channel is created. In the foregoing 3 dB/bit-tone is used.

2) A method describing the performance of all Reed-Solomon codes is created.

In the foregoing a two dimensional table of maximum size Reed-Solomon codewords is indexed by the margin and the correcting power of the Reed-Solomon code. Of course, the pertinent entries in this table could be computed as part of the method, but this would likely have real time problems. Other table configurations are possible but use too much memory. This particular table configuration is advantageous.

3) An approximate compensation method for inherent inaccuracies in 2) is created. Reed-Solomon corrections occur on a per byte basis and analysis of Reed-Solomon performance is usually based on the error events between bytes being uncorrelated. In a DMT-ADSL modem errors occur on a per constellation basis and single error events can affect multiple adjacent bytes. In addition, the use of trellis coding greatly increases the number of adjacent bytes affected by each error event.

In the foregoing it is assumed that error events that create multiple adjacent byte errors are the primary cause of performance deviation from the computed Reed-Solomon performance table. Since interleaving separates adjacent bytes into different Reed-Solomon codewords, the amount of interleaving present determines the extent of this effect. The method estimates that without trellis coding up to N adjacent bytes are affected by each error event while with trellis coding up to M adjacent bytes are affected by each error event. The performance degradation is modeled by dividing the Reed-Solomon correcting power by the number of adjacent bytes that can be affected by each error event.

4) An optimum search first determines the maximum data rate with no Reed-Solomon parity bytes and then adds data bytes (one at a time), determines the margin, determines the minimum number of Reed-Solomon parity bytes required for acceptable reception, computes the resultant data rate, and tracks the configuration that yields the highest data rate. The search is ended when no Reed-Solomon configuration can work at the proposed margin.

This search can be expanded to include the dual latency case. For dual latency, two Reed-Solomon configurations are computed from the available number of data bytes and margin. Various criteria can be used to apportion data to one or the other latency path. In the current implementation, one latency path is required to have a fixed data rate.

The search can also be enhanced to require extra or minimum Reed-Solomon correcting power in order to provide protection against impulsive error events. The foregoing enforces a minimum number of parity bytes when the interleave depth is greater than some minimum.

The foregoing provides 4 different Reed-Solomon configurations, each with slightly different performance target. This provides a mechanism to work around the cost function approximation (see 6)

5) A sub-optimum search is used to provide parameters to optimum search 4). This sub-optimum search uses fixed estimates for the percent of Reed-Solomon parity bytes and required margin. This search may iterate one or more times in order to provide a more accurate set of parameters to optimum search 4). Note that the DMT-ADSL standard restricts some of the Reed-Solomon coding parameters that the ATUR can use during this search. Thus, even if the ATUR implemented the full optimum search, part 4) would still be required.

In the foregoing, different searches are used on the ATUC and ATUR.

On the ATUC the maximum channel capacity is measured with no Reed-Solomon parity bytes. This provides an accurate estimate, unless some Reed-Solomon parity bytes are needed in order to be able to transfer any data. Under this condition, the channel capacity is small and a "back up" method provides a selection of Reed-Solomon codeword configurations at 1, 2, 3 and 4 user data bytes per frame. It has been empirically determined that no upstream line condition-Reed-Solomon configuration combination will increase a channel capacity from 0 with no Reed-Solomon corrections to more than 4 user data bytes with Reed-Solomon corrections.

On the ATUR an iterative method is used, because the wider bandwidth of the downstream DMT-ADSL signal requires more accuracy to estimate the channel capacity. First the channel capacity is estimated at a fixed margin that is representative of the typical acceptable margin usable with Reed-Solomon coding. This estimated channel capacity is used to select a Reed-Solomon codeword that has a fixed percentage of parity bytes. The required margin to receive this configuration is determined by method 2). Then the channel capacity is re-estimated using the new required margin. If the coding gain of the channel with this configuration is negative, the channel capacity is estimated again with no Reed-Solomon parity bytes. If trellis coding is enabled, the channel capacity is estimated with no Reed-Solomon parity bytes.

6) A selection method is used to determine which of the proposed Reed-Solomon configurations is acceptable. The required margin for the Reed-Solomon configuration is determined by methods 2) and 3). The channel capacity is computed for this margin, and if it is adequate to convey the proposed Reed-Solomon configuration it is selected.

7) The required margin computed in part 6) continues to be used while the modem is running in order to estimate the current performance of the modem.

4. Modifications

The preferred embodiments can be modified in various ways while retaining the features of maximizing error-corrected data rates given channel MSE and coding style by selecting the codeword configuration (N and R). For example, Galois fields other than GF(256) could be used, and bytes may be replaced with other groupings of bits, . .

What is claimed is:

1. A method of selection of codeword configuration, comprising:
    (a) for a triple of (1) an integer R, (2) a number MSE, and (3) a number EC-BER, finding an integer N where a codeword of N bytes which includes R parity bytes yields an error-corrected error rate not greater EC-BER when used in a channel with a mean squared error of MSE and where N is the largest such integer not greater than an upper bound;
    (b) repeating step (a) with a different integer R but with the same numbers MSE and EC-BER;
    (c) selecting an N and R from the results of steps (a) and (b).

* * * * *